United States Patent
Akselrod et al.

(10) Patent No.: US 10,199,415 B2
(45) Date of Patent: Feb. 5, 2019

(54) FABRICATION OF OPTICAL METASURFACES

(71) Applicant: Elwha LLC, Bellevue, WA (US)

(72) Inventors: Gleb M. Akselrod, Durham, NC (US); Erik E. Josberger, Seattle, WA (US); Mark C. Weidman, Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

(21) Appl. No.: 15/799,654

(22) Filed: Oct. 31, 2017

(65) Prior Publication Data

US 2018/0240653 A1 Aug. 23, 2018

Related U.S. Application Data

(60) Provisional application No. 62/462,105, filed on Feb. 22, 2017.

(51) Int. Cl.
| | |
|---|---|
| *H01L 27/14* | (2006.01) |
| *H01L 27/146* | (2006.01) |
| *G02F 1/29* | (2006.01) |
| *G02B 5/18* | (2006.01) |
| *G03H 1/04* | (2006.01) |

(Continued)

(52) U.S. Cl.
CPC ...... *H01L 27/14625* (2013.01); *G01S 7/4813* (2013.01); *G01S 7/4817* (2013.01); *G01S 17/10* (2013.01); *G01S 17/42* (2013.01); *G01S 17/89* (2013.01); *G02B 5/1809* (2013.01); *G02F 1/0107* (2013.01); *G02F 1/1339* (2013.01); *G02F 1/1341* (2013.01); *G02F 1/292* (2013.01); *G03H 1/0443* (2013.01); *H01J 37/3174* (2013.01); *H01J 37/32816* (2013.01); *H01L 27/14643* (2013.01); *H01Q 1/38* (2013.01); *H01Q 3/44* (2013.01); *H01Q 15/002* (2013.01); *H01Q 15/0066* (2013.01); *H01Q 15/02* (2013.01); *H01Q 15/148* (2013.01);

(Continued)

(58) Field of Classification Search
None
See application file for complete search history.

(56) References Cited

U.S. PATENT DOCUMENTS

2010/0075262 A1\* 3/2010 Koefer ................. G02B 3/0018
430/321
2010/0276665 A1\* 11/2010 Wang .................. H01L 21/0237
257/15

(Continued)

FOREIGN PATENT DOCUMENTS

CN 103259097 A 8/2013

OTHER PUBLICATIONS

PCT International Search Report; International App. No. PCT/US2018/019036; dated Jun. 11, 2018; pp. 1-3.

(Continued)

*Primary Examiner* — Scott B Geyer

(57) ABSTRACT

The method is provided for fabricating an optical metasurface. The method may include depositing a conductive layer over a holographic region of a wafer and depositing a dielectric layer over the conducting layer. The method may also include patterning a hard mask on the dielectric layer. The method may further include etching the dielectric layer to form a plurality of dielectric pillars with a plurality of nano-scale gaps between the pillars.

21 Claims, 11 Drawing Sheets

(51) Int. Cl.

| | | |
|---|---|---|
| H04N 5/225 | (2006.01) | |
| H04N 5/374 | (2011.01) | |
| G01S 7/481 | (2006.01) | |
| H01Q 1/38 | (2006.01) | |
| H01Q 3/44 | (2006.01) | |
| H01Q 15/00 | (2006.01) | |
| H01Q 15/02 | (2006.01) | |
| H01Q 15/14 | (2006.01) | |
| G01S 17/10 | (2006.01) | |
| G01S 17/42 | (2006.01) | |
| G01S 17/89 | (2006.01) | |
| G02F 1/01 | (2006.01) | |
| G02F 1/1339 | (2006.01) | |
| G02F 1/1341 | (2006.01) | |
| H01J 37/317 | (2006.01) | |
| H01J 37/32 | (2006.01) | |

(52) U.S. Cl.
CPC ........... *H04N 5/2253* (2013.01); *H04N 5/374* (2013.01); *G02F 2202/103* (2013.01); *H01J 2237/334* (2013.01)

(56) References Cited

U.S. PATENT DOCUMENTS

| | | | |
|---|---|---|---|
| 2012/0194399 | A1 | 8/2012 | Bily et al. |
| 2014/0268946 | A1 | 9/2014 | Bily et al. |
| 2015/0162658 | A1 | 6/2015 | Bowers et al. |
| 2015/0318618 | A1 | 11/2015 | Chen et al. |
| 2015/0318620 | A1 | 11/2015 | Black et al. |
| 2015/0372389 | A1 | 12/2015 | Chen et al. |
| 2015/0380828 | A1 | 12/2015 | Black et al. |
| 2016/0320531 | A1* | 11/2016 | Kamali ................. G02B 5/0263 |
| 2016/0370568 | A1* | 12/2016 | Toussaint ............. C03C 17/3657 |
| 2017/0047312 | A1 | 2/2017 | Budd et al. |
| 2017/0212285 | A1* | 7/2017 | Arbabi ................. G02B 5/1847 |
| 2018/0239213 | A1* | 8/2018 | Akselrod ............. G01S 7/4817 |

OTHER PUBLICATIONS

PCT International Search Report; International App. No. PCT/US2018/019269; dated Jun. 4, 2018; pp. 1-4.

Arbabi et al.; "Dielectric metasurfaces for complete control of phase and polarization with subwavelength spatial resolution and high transmission"; Nature Nanotechnology 2015; pp. 1-9; Macmillan Publishers Limited.

Arbabi et al.; "Dielectric metasurfaces for complete control of phase and polarization with subwavelength spatial resolution and high transmission"; Nature Nanotechnology; Aug. 31, 2015; pp. 937-943; vol. 10; Macmillan Publishers Limited.

Y. Huang et al., "Gate-tunable conducting oxide metasurfaces," Nano Lett. 16, 5319 (2016).

A. Pors, S. I. Bozhevolnyi, "Plasmonic metasurfaces for efficient phase control in reflection," Opt. Express 21, 27438 (2013).

A. Arbabi, Y. Horie, A. J. Ball, M. Bagheri, A. Faraon, "Subwavelength-thick lenses with high numerical apertures and large efficiency based on high contrast transmitarrays," Nat. Commun. 6, 1 (2014).

C. Haffner et al., "All-plasmonic Mach-Zehnder modulator enabling optical high-speed communication at the microscale." Nat. Photonics 9, 525-528 (2015).

M. Li et al., "Poling efficiency enhancement of tethered binary nonlinear optical chromophores for achieving an ultrahigh $n_3 r_{33}$ figure-of-merit of 2601 pm V?1" J. Mater. Chem. C 3, 6737-6744 (2015).

X. Zhang et al., "High performance optical modulator based on electro-optic polymer filled silicon slot photonic crystal waveguide," J. Light. Technol. 34, 2941-2951 (2016).

Y. Xing et al., "Digitally controlled phase shifter using an SOI slot waveguide with liquid crystal infiltration," 27, 1269-1272 (2015).

V. Borshch, S. V. Shiyanovskii, O. D. Lavrentovich, "Nanosecond electro-optic switching of a liquid crystal," Phys. Rev. Lett. 111, 107802 (2013).

H. Chen et al., "Ultra-low viscosity liquid crystal materials," Opt. Mater. Express 5, 655 (2015).

B. Gholipour, J. Zhang, K. F. MacDonald, D. W. Hewak, N. I. Zheludev, "An all-optical, non-volatile, bidirectional, phase-change meta-switch," Adv. Mater. 25, 3050 (2013).

S. Raoux, F. Xiong, M. Wuttig, E. Pop, "Phase change materials and phase change memory," MRS Bull. 39, 703 (2014).

C. Rios, et al., "Integrated all-photonic non-volatile multi-level memory," Nat. Photonics 9, 725 (2015).

* cited by examiner

FABRICATION OF OPTICAL METASURFACES

If an Application Data Sheet ("ADS") has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

If the listings of applications provided above are inconsistent with the listings provided via an ADS, it is the intent of the Applicant(s) to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

CROSS-REFERENCE TO RELATED PATENT APPLICATION

The present application claims the benefit of the earliest available effective filing date(s) from the following listed application(s) (the "Priority Applications"), if any, listed below (e.g., claims earliest available priority dates for other than provisional patent applications, or claims benefits under 35 U.S.C. § 119(e) for provisional patent applications, for any and all parent, grandparent, great-grandparent, etc. applications of the Priority Application(s)).

Priority Applications

The present application claims benefit of priority of United States Provisional Patent Application No. 62/462,105, entitled "Optical Surface Scattering Antennas," filed on Feb. 22, 2017, which was filed within the twelve months preceding the filing date of the present application or is an application of which a priority application is entitled to the benefit of the filing date.

FIELD

The disclosure is directed to methods for fabrication of metasurfaces. In particular, the disclosure is directed to a combination of high resolution and low resolution processes for fabrication of metasurfaces including arrays of dielectric pillars with nano-scale gaps between the dielectric pillars. The fabrication process also includes filling the nano-scale gaps with a refractive index tunable core material.

BACKGROUND

Autonomous systems, such as vehicles, drones, robotics, security, mapping, among others, need to view the world in 3D. Scanning Light Detection and Ranging (Lidar) is the 3D sensor for self-driving cars. The current Lidar is unreliable, bulky and high cost. Lidar can also be used to make high-resolution maps and provides dynamic field of view.

Solid state Lidar uses chips and does not include moving parts and thus has high reliability. The solid state Lidar also uses low power, and small packages, and is able to use low cost CMOS fabrication technique. The solid state Lidar can have mass production. However, there still remains a need to develop techniques to produce solid-state Lidar.

BRIEF SUMMARY

In an embodiment, a method is provided for fabricating an optical metasurface. The method may include depositing a conductive layer over a holographic region of a wafer and depositing a dielectric layer over the conducting layer. The method may also include patterning a hard mask on the dielectric layer. The method may further include etching the dielectric layer to form a plurality of dielectric pillars with a plurality of nano-scale gaps between the pillars.

In an embodiment, a method is provided for fabricating dielectric pillars having a nano-scale gap inbetween. The method may include depositing a dielectric layer over a conducting layer. The method may also include patterning a hard mask on the dielectric layer by a high resolution process. The method may further include applying a plasma to etch a portion of a dielectric layer at a temperature below room temperature in a chamber to form dielectric pillars with the nano-scale gap.

Additional embodiments and features are set forth, in part, in the description that follows, and will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

The description will be more fully understood with references to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

Overview

The disclosure provides methods for fabricating a holographic metasurface device, which is operable at higher frequencies, especially at infrared or visible frequencies. When operating frequencies are scaled up to optical (infrared/visible) frequencies, the sizes of individual scattering elements and the spacing between adjacent scattering elements are proportionally scaled down to preserve the sub-wavelength/metamaterial aspect of the technology. The relevant length scales for operation at optical frequencies are typically on the order of microns or less, which are smaller than the typical length scales for conventional printed circuit board (PCB) processes.

The methods include micro-lithographic processes, which are referred to a low resolution process for processing features larger than 1 µm. The disclosure also includes nano-lithographic processes for features as small as 50 nm, which are also referred to a high resolution process.

The disclosure also provides methods for etching the a-Si pillars below room temperature to reduce undercut, for example, less than 10 nm.

Figure 1A:
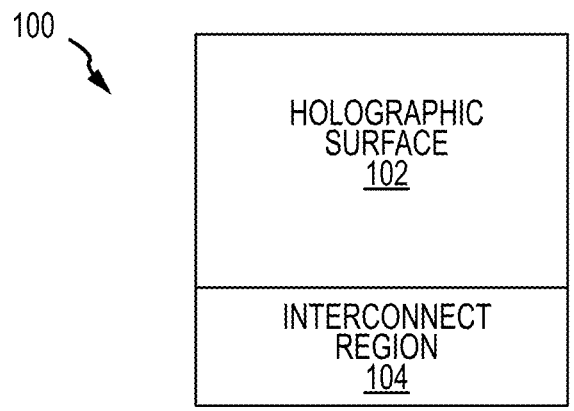
FIG. 1A shows a top overview of a holographic metasurface device in accordance with embodiments of the disclosure.

FIG. 1A shows a top overview of a holographic metasurface device in accordance with embodiments of the disclosure. As shown in FIG. 1A, a holographic metasurface device 100 has a holographic metasurface region 102, including an array of holographic elements on a first portion of a wafer 114, which can be seen in FIG. 1B or FIG. 1C. The holographic metasurface region 102 includes an array of hologram elements. Each holographic element includes a pair of dielectric pillars and a refractive index tunable core between the pair of dielectric pillars. The dielectric pillars may be formed of amorphous silicon (a-Si) or crystalline silicon.

The holographic metasurface device 100 may also have an interconnect region 104 including CMOS transistors on a second portion of the wafer. The CMOS transistors in the interconnect region 104 can control the voltage applied to the dielectric pillars of each of the holographic elements. The CMOS transistors have low static power consumption and high noise immunity. The array of holographic elements and the electrical control circuit are decoupled.

Figure 1B:
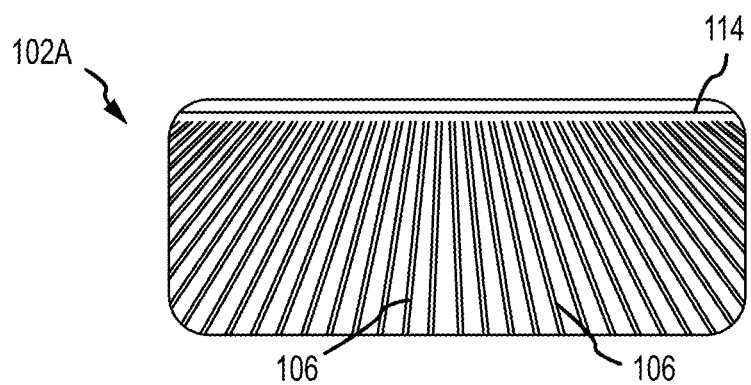
FIG. 1B is a perspective view of a 1D holographic metasurface device in accordance with embodiments of the disclosure.

FIG. 1B is a perspective view of 1D holographic metasurface device in accordance with embodiments of the disclosure. As shown in FIG. 1B, an array 102A includes a plurality of columns of holographic elements 106 arranged linearly on a wafer.

Figure 1C:
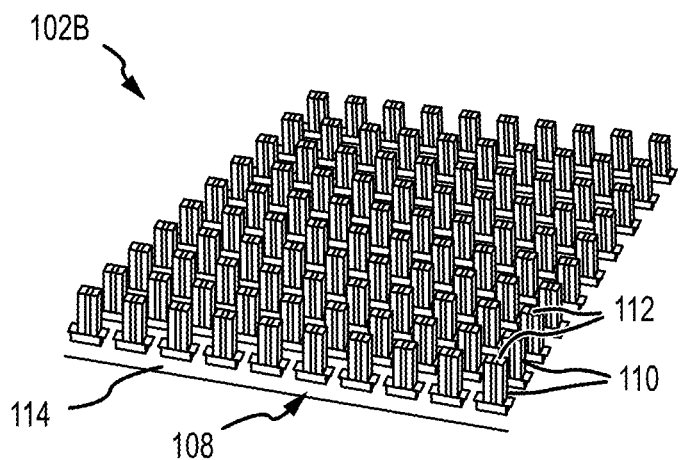
FIG. 1C is a perspective view of a 2D holographic metasurface device in accordance with embodiments of the disclosure.

FIG. 1C is a perspective view of 2D holographic metasurface device in accordance with embodiments of the disclosure. As shown in FIG. 1C, an array 102B may also include a plurality of holographic elements 108 arranged in rows 110 and columns 112 on a wafer 114.

Figure 2A:
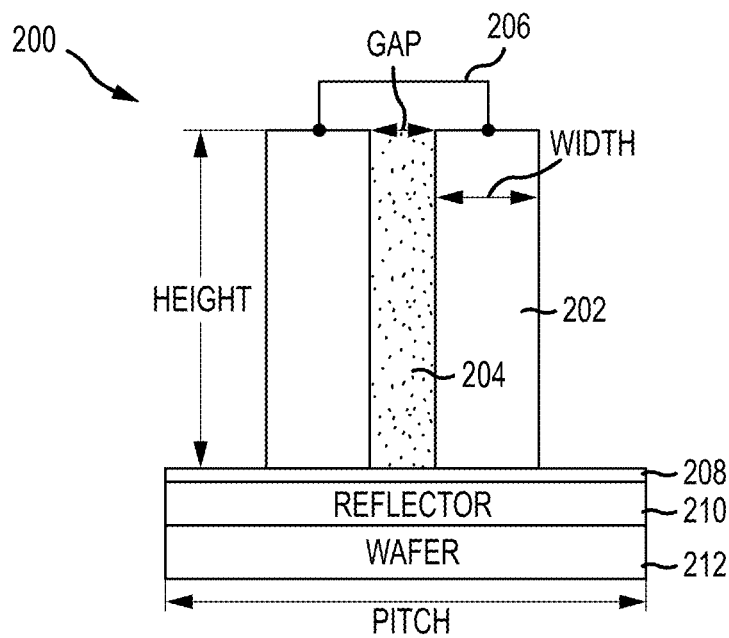
FIG. 2A shows a side view of one sub-wavelength holographic element including a pair of a-Si pillars in the array of FIG. 1B or 10 in accordance with embodiments of the disclosure.

FIG. 2A shows a side view of one of the sub-wavelength holographic element including a pair of a-Si pillars in the array of FIG. 1B in accordance with embodiments of the disclosure. As depicted, a holographic element 200, e.g. a sub-wavelength metasurface holographic element, includes a refractive index tunable material 204 between two dielectric pillars 202, such as a-Si pillars over a wafer 210. The wafer 210 may be a crystalline silicon wafer, among others. A control voltage 206 is applied across the two dielectric pillars 202. The electric and magnetic energy densities are across the holographic element 200. The dielectric pillars 202 are placed over an oxide layer 208, such as $Al_2O_3$, which is an etch stop layer.

A metallic reflector 210 is placed between the wafer 210 and the oxide layer 206. In some embodiments, the metal reflector 210 under the dielectric pillars 202, such as amorphous silicon (a-Si) pillars, may be made from copper, aluminum, or a CMOS-compatible metal, without sacrificing performance. The noble metals gold and silver are not CMOS-compatible.

The grazing incidence of the incident wave excites magnetic-like Mie resonances in the a-Si pillars with a high Q factor, enabling dynamic modulation of the phase. Additionally, the a-Si pillars are deposited over a metallic reflector, which makes the structure operate as a reflect-array and thus is possible to integrate with control electronics. The resonator includes two silicon sub-pillars that are separated by a tunable core material having a tunable refractive index.

Under the grazing incidence excitation, the electric field is strongly localized in the core between the pillars, while the magnetic field is strongly localized to the entire hologram element including the pillars and the core.

The reflection phase of the dielectric pillars is sensitive to the refractive index of the core material, with phase modulation of nearly $2\pi$ possible with an index modulation of $\Delta n/n$ of about 7%. The high sensitivity to the refractive index of the core material is enabled by the high Q of the resonance, for example, a Q of 64, which can be seen in a simulated reflection spectrum (not shown). The high sensitivity of the reflection phase to the refractive index of the core enables the integration of refractive index tunable core material into the Si pillars to create dynamic metasurfaces.

Since the refractive index modulation range of the tunable dielectric materials may be small, one challenge for designing an array of tunable radiating or scattering elements is to create a high Q factor, low-loss, subwavelength resonators. The Q factor is a dimensionless parameter that characterizes a resonator's bandwidth relative to its center frequency. High Q factor indicates a lower rate of energy loss relative to the stored energy of the resonator. Resonators with high Q factors have low damping.

Tunable Core Material

Liquid Crystal

Liquid crystals (LCs) exhibit anisotropy in the refractive index, which depends on molecular orientation of the liquid crystals. The refractive index of the liquid crystal can be controlled with an AC electric field. In the widely-used nematic liquid crystals, modulation between the extraordinary and ordinary refractive index can be up 13%, exceeding the performance of EO polymers.

In some embodiments, an LC material has a relatively high switching speed. The switching time of LCs can be significantly reduced in geometries with smaller electrode spacing and low viscosity LCs, such that microsecond switching times are possible in metasurface structures. The switching time can be further reduced by employing orthogonal electrodes. The high switching speed LCs may be suitable for scanning Light Detection and Ranging (Lidar) or computational imaging based on structured illumination where MHz speeds may be desired.

Electro-Optic Polymers

Electro-optic (EO) polymer materials exhibit a refractive index change based on second order polarizability, known as the Pockels Effect, where the index modulation is proportional to the applied static or RF electric field. The index modulation is given by:

$$\Delta n = \frac{1}{2} n^3 r_{33} E$$

where n is the linear refractive index, E is the applied electric field and $r_{33}$ is the Pockels coefficient. The electric field is limited by a dielectric breakdown. The EO polymers can potentially achieve index modulation as large as 6%.

The response time of EO polymers is extremely fast (i.e. several fs), resulting in device modulation speeds of at least 40 GHz. Due to their large nonlinear coefficients, compared with crystalline electro-optic crystalline materials, such as lithium niobate, EO polymers promise compact modulators, enabling high-density photonic integrated circuits.

In some approaches, EO polymers may be suitable for applications where switching rates of MHz and GHz may be desired, such as Lidar single beam scanning and structured illumination, or free space optical communications with holograms that simultaneously perform beam forming and data encoding, thus allowing multi-user MIMO schemes.

Chalcogenide Glasses

Chalcogenide glasses have a unique structural phase transition from the crystalline phase to the amorphous phase—which have strikingly different electrical and optical properties—with refractive index modulation in the short wave infrared spectrum of about 30%. The phase transition is thermally induced, which is typically achieved through direct electrical heating of the chalcogenide glasses. A prototypical chalcogenide glass is $Ge_2Sb_2Te_5$ (GST), which becomes crystalline at about 200° C. and can be switched back to the amorphous state with a melt-quenching temperature of about 500° C.

In addition to the large index modulation between the amorphous and crystalline states of about 30%, another attractive feature of the GST is that the material state can be maintained in the absence of any additional electrical stimulus. For this reason, GST is nearing commercialization as next-generation non-volatile electronic memory and has also been demonstrated as a constituent of all-optical memory.

In some embodiments, a chalcogenide glass material may be suitable for applications where it is desired to only occasionally reconfigure metasurfaces and yet provide good thermal stability and environmental stability. For example, in free space optical links, gradual drift of the transmitter or receiver may be compensated by low duty cycle changes to the beam pointing direction. At the same time, the large index modulation in these materials allows for the use of lower Q resonators, simplifying design and easing fabrication tolerances.

Turning to FIG. 2A again, as an example, the excitation is at 80° relative to normal and transverse magnetic (TM) polarized. The reflection phase is as a function of refractive index of the tunable core material. The reflection spectrum of a metasurface element shows a peak near a laser wavelength of 1550 nm. A Q factor for resonance may be 64. The voltage may vary from −5 v to 5 v. The silicon pillar is 480 nm high and 100 nm wide. The nano-scale gap between the two pillars is 60 nm. The pitch of the element is 400 nm. The Cu reflector is about 150 nm thick, and the oxide layer between the bottom of the pillars and the Cu reflector is about 25 nm thick.

In some embodiments, the nano-scale gap may vary from 75 nm to 200 nm. In some embodiments, the gap is equal to or greater than 75 nm. In some embodiments, the gap is equal to or greater than 100 nm. In some embodiments, the gap is equal to or greater than 125 nm. In some embodiments, the gap is equal to or greater than 150 nm. In some embodiments, the gap is equal to or greater than 175 nm. In some embodiments, the gap is equal to or less than 200 nm. In some embodiments, the gap is equal to or less than 175 nm. In some embodiments, the gap is equal to or less than 150 nm. In some embodiments, the gap is equal to or less than 125 nm. In some embodiments, the gap is equal to or less than 100 nm.

In some embodiments, the pitch of the element may vary from 200 nm to 1.6 µm. In some embodiments, the pitch is equal to or greater than 200 nm. In some embodiments, the pitch is equal to or greater than 400 nm. In some embodiments, the pitch is equal to or greater than 600 nm. In some embodiments, the pitch is equal to or greater than 800 nm. In some embodiments, the pitch is equal to or greater than 1.0 µm. In some embodiments, the pitch is equal to or greater than 1.2 µm. In some embodiments, the pitch is equal to or greater than 1.4 µm. In some embodiments, the pitch is equal to or less than 1.6 µm. In some embodiments, the pitch is equal to or less than 1.4 µm. In some embodiments, the pitch is equal to or less than 1.2 µm. In some embodiments, the pitch is equal to or less than 1.0 µm. In some embodiments, the pitch is equal to or less than 800 nm. In some embodiments, the pitch is equal to or less than 600 nm. In some embodiments, the pitch is equal to or less than 400 nm.

In some embodiments, the depth of the pillars may range from 50 nm to 50 µm. In some embodiments, the depth is equal to or greater than 50 nm. In some embodiments, the depth is equal to or greater than 100 nm. In some embodiments, the depth is equal to or greater than 150 nm. In some embodiments, the depth is equal to or greater than 200 nm. In some embodiments, the depth is equal to or greater than 400 nm. In some embodiments, the depth is equal to or greater than 600 nm. In some embodiments, the depth is equal to or greater than 800 nm. In some embodiments, the depth is equal to or greater than 1.0 µm. In some embodiments, the depth is equal to or greater than 10 µm. In some embodiments, the depth is equal to or greater than 20 µm. In some embodiments, the depth is equal to or greater than 30 µm. In some embodiments, the depth is equal to or greater than 40 µm.

In some embodiments, the depth is equal to or less than 50 µm. In some embodiments, the depth is equal to or less than 40 µm. In some embodiments, the depth is equal to or less than 30 µm. In some embodiments, the depth is equal to or less than 20 µm. In some embodiments, the depth is equal to or less than 10 µm. In some embodiments, the depth is equal to or less than 1 µm. In some embodiments, the depth is equal to or less than 800 nm. In some embodiments, the depth is equal to or less than 600 nm. In some embodiments, the depth is equal to or less than 400 nm. In some embodiments, the depth is equal to or less than 200 nm. In some embodiments, the depth is equal to or less than 150 nm. In some embodiments, the depth is equal to or less than 100 nm.

In some embodiments, the width of the pillars may range from 50 nm to 1 µm.

Figure 2B:
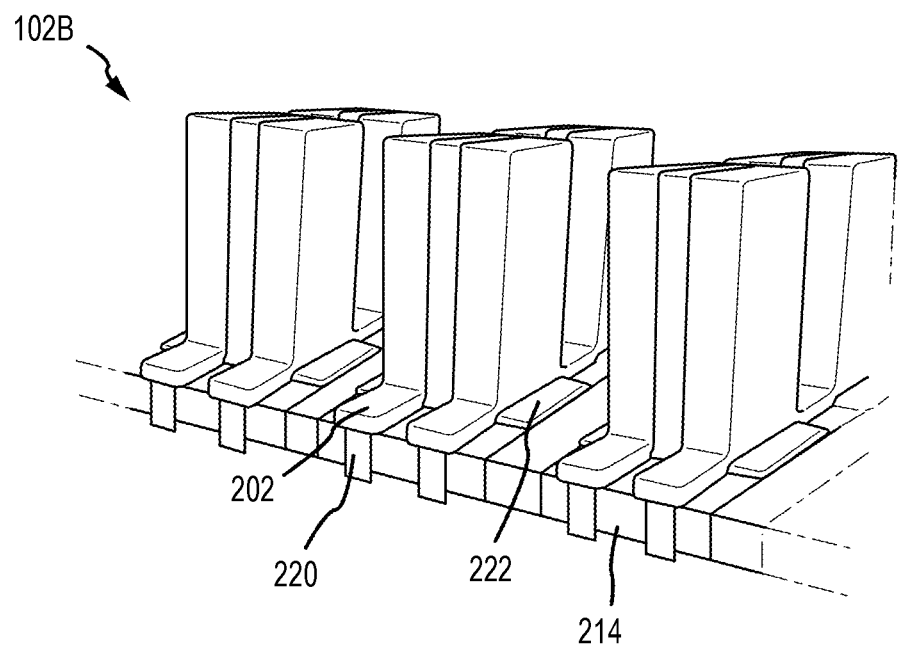
FIG. 2B shows a schematic of the 2D holographic metasurface including metal vias in accordance with embodiments of the disclosure.

FIG. 2B shows a schematic of the 2D holographic metasurface including metal vias in accordance with embodiments of the disclosure. As shown, the dielectric pillars have an extension parallel to the wafer. The extension of each sub-pillar 202 is connected to a metal via 220.

Processes

The disclosure provides a process suitable for large-scale commercial fabrication. The dielectric pillars, such as amorphous silicon (a-Si) or poly-crystalline silicon, may be deposited by using plasma-enhanced chemical vapor deposition (PECVD) or CVD.

The nano-scale gaps between the dielectric pillars may be formed by etching using either electron beam lithography, for smaller production volumes (e.g. prototyping), or with deep UV immersion lithography, for large production volumes.

The complementary metal-oxide-semiconductor (CMOS) transistors can be fabricated on a wafer, such as a crystalline silicon wafer. Then, the CMOS transistors can be connected through metal vias to the dielectric pillars for applying a voltage to each pair of pillars, which acts as a capacitor. The metal vias can be planarized with deposition of an oxide layer (e.g. $SiO_2$ deposition), followed by chemical mechanical polishing (CMP) to achieve sub-nanometer surface flatness over the wafer. The CMOS transistors may be metal-oxide-semiconductor field-effect transistors (MOSFETs). The fabrication processes are compatible with CMOS processes.

Figure 3:
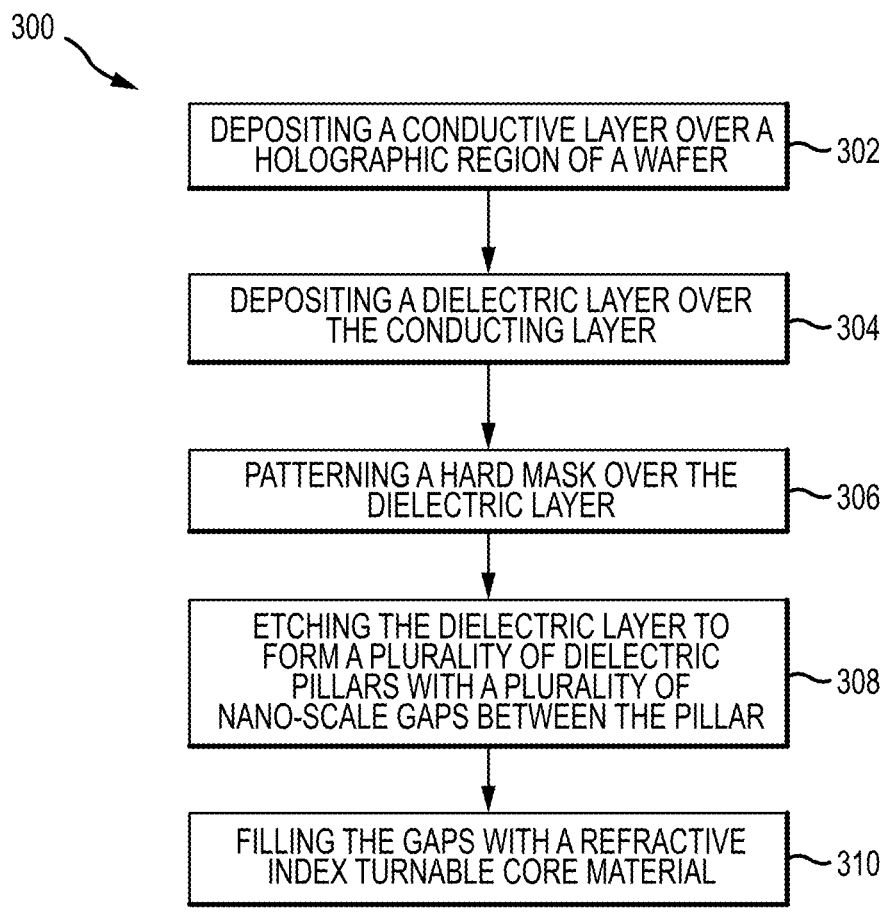
FIG. 3 is a flow chart illustrating the steps of forming the 1D holographic metasurface in accordance with embodiments of the disclosure.

FIG. 3 is a flow chart illustrating the steps of forming the 1D holographic metasurface in accordance with embodiments of the disclosure. A method 300 for fabricating a holographic metasurface device may include depositing a conductive layer over a holographic region of a wafer at operation 302. The method 300 may also include depositing a dielectric layer (e.g. a-Si) over the conducting layer at operation 304.

The method 300 may further include patterning a hard mask (e.g. $Al_2O_3$) on the dielectric layer (e.g. a-Si) at operation 306.

In some embodiments, the patterning may be performed by e-beam lithography when volume is small. The e-beam lithography includes scanning a focused beam of electrons on a surface covered with an electron-sensitive film, e.g. a resist. The electron beam can change the solubility of the resist, enabling selective removal of either exposed or non-exposed regions of the resist by immersing the resist in a solvent, e.g. developer. The e-beam lithography can create very small structures or patterns in the resist that can be subsequently transferred to a substrate material by etching. The e-beam lithography can create patterns with a sub-10 nm resolution.

In some embodiments, the patterning may also be performed by deep-UV immersion lithography for large volume production. In some embodiments, the gap size may be about 100 nm, and is within the limits of deep UV immersion lithography. The deep UV immersion lithography uses UV light to transfer a geometric pattern from a photomask to a light-sensitive chemical photoresist on a substrate. The pattern in the etching resist is created by exposing to UV light, either directly, without using a mask, or with an optical mask. The photoresist is exposed to a pattern of intense UV light. The exposure to UV light can cause a chemical change that allows the photoresist to be removed by a solution or a developer. The photoresist may become soluble in the developer when exposed or unexposed regions may be soluble in the developer.

In the deep UV immersion lithography, UV light travels down through a system of lenses and then through a liquid medium (e.g. water) before reaching the photoresist on the wafer. The deep UV immersion lithography replaces an air gap between the lenses and the wafer surface with the liquid medium that may have a refractive index greater than one. The resolution can be increased by a factor equal to the refractive index of the liquid. The deep UV immersion lithography uses light from lasers with wavelengths of 248 nm and 193 nm, which allow small feature sizes down to 50 nm.

The method 300 may also include etching the dielectric layer to form a plurality of dielectric pillars (e.g. a-Si pillars) with a plurality of nano-scale gaps between the pillars at operation 308.

The refractive index tunable core material can be integrated or filled into the nano-scale gaps between the dielectric pillars. For example, the tunable core material may include liquid crystals and EO polymers, which can be deposited directly via spin coating, such that the liquid crystals fill the nano-scale gaps between the dielectric pillars via capillary action. The method 300 may further include filling the plurality of nano-scale gaps with a refractive index tunable core material at operation 310.

In some embodiments, the refractive index tunable core material may include a liquid crystal or EO polymers. The filling of the liquid crystal may include preparing the surface to be hydrophobic or hydrophilic, followed by spin coating the liquid crystal over the plurality of pillars, and continued with filling the liquid crystal into the nano-scale gap by a capillary action and encapsulating the liquid crystal with a clear coating.

In some embodiments, the filling of the liquid crystal may include applying a coating to a first portion of the plurality of nano-scale gaps, followed by spin coating the liquid crystal onto the plurality of dielectric pillars, then filling the liquid crystal into a second portion of the plurality of nano-scale gaps by a capillary action, and continues with encapsulating the liquid crystal with a clear coating.

Figure 4A:
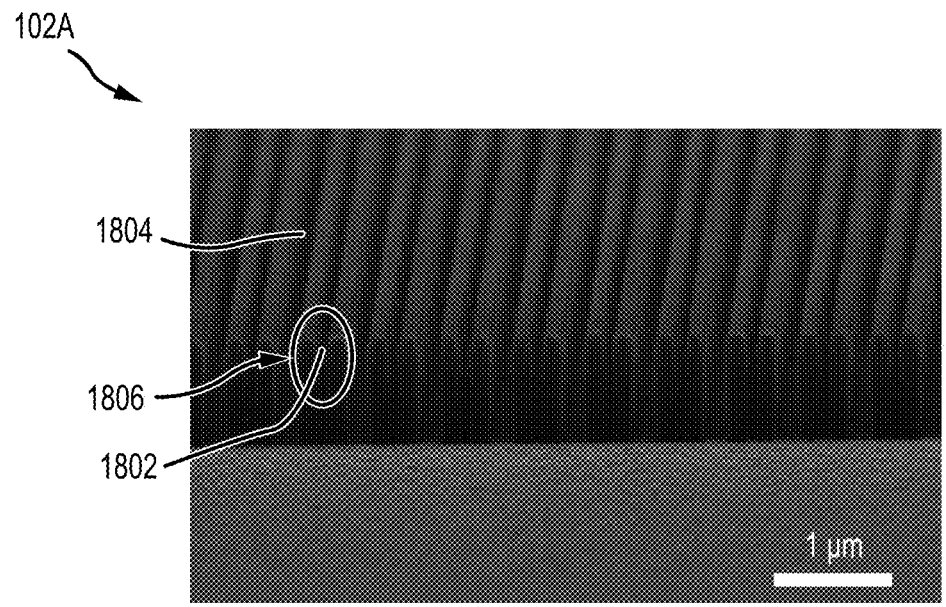
FIG. 4A shows the 1D metasurface before the integration of liquid crystals in accordance with embodiments of the disclosure.
Figure 4B:
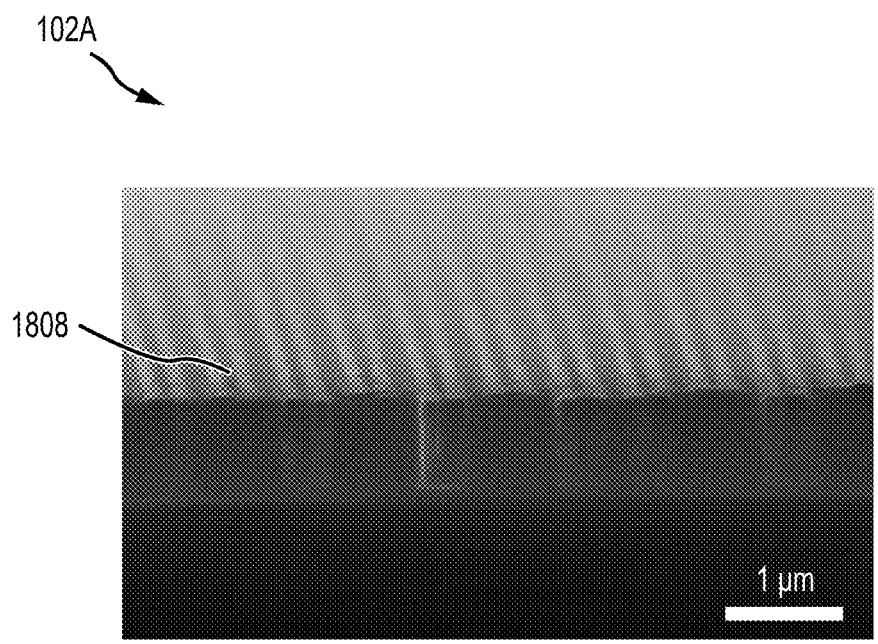
FIG. 4B shows the 1D metasurface after the integration of liquid crystals in accordance with embodiments of the disclosure.

FIG. 4A shows the 1D metasurface before the integration of liquid crystals with the dielectric pillars in accordance with embodiments of the disclosure. FIG. 4B shows the 1D metasurface before the integration of liquid crystals in accordance with embodiments of the disclosure. Liquid crystal infiltration may occur by capillary action. Each pair of pillars is individually voltage biased to create arbitrary holograms.

In some embodiments, the nano-scale gap 404 may have substantially the same width as the gap 402. In some embodiments, the gap 404 may be larger than the gap 402, as shown in FIG. 4A. In some embodiments, all the nano-scale gaps between the pillars for each holographic element 406 are filled with a refractive index tunable core material, e.g. liquid crystal, as shown in FIG. 4B, which may be simple and low cost.

In some embodiments, every other gap 404 between the pillars, i.e. between the adjacent pairs of pillars, may be covered with a surface coating. For example, a surface coating 408 may be applied to cover some nano-scale gaps, such as the larger gaps 404 between the holographic elements. With the coating, only the small gaps 402 between the pillars in each holographic element are filled with the refractive index tunable core material, such as liquid crystals. The surface of the dielectric pillars may be prepared to be either hydrophobic or hydrophilic to encourage the filling of the tunable core material or preventing the filling of the tunable core material in some nano-scale gaps, depending on the type of tunable core material.

In the case of chalcogenide glass such as GST, sputtering can be employed, followed by a wet or dry etch to remove the GST from all areas except inside the pillar cores.

EXAMPLES

Figure 5:
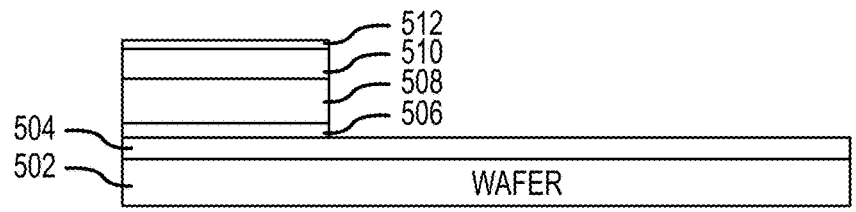
FIG. 5 shows a cross-sectional view of deposition of a conductive layer for wirebond on a first portion of a wafer in accordance with embodiments of the disclosure.

FIG. 5 shows a cross-sectional view of deposition of a conductive layer for wirebond on a first portion of a wafer in accordance with embodiments of the disclosure. As shown in FIG. 5, a first conductive layer 508 is deposited over a dielectric layer 504 (e.g. $SiO_2$), which is deposited over a wafer 502 (e.g. crystalline silicon wafer). The deposition of $SiO_2$ may use CVD, thermal oxidation or PECVD, among others. The first conductive layer for wirebond may include copper (Cu), aluminum (Al), or other CMOS compatible metals, among others.

A first Ti adhesion layer 506 is deposited between the first conductive layer 508 and the $SiO_2$ layer 504 underneath. A second Ti adhesion layer 510 is deposited between the first conductive layer 508 and a $TiO_2$ layer 512 above. The deposition of the first conductive layer and the Ti adhesion layer may use sputtering, or physical vapor deposition (PVD), among others. The deposition of $TiO_2$ may use CVD, or PECVD, among others. The $TiO_2$ layer 512 acts as an adhesion layer to the oxide layer (e.g. $SiO_2$) above (not shown).

Figure 6:
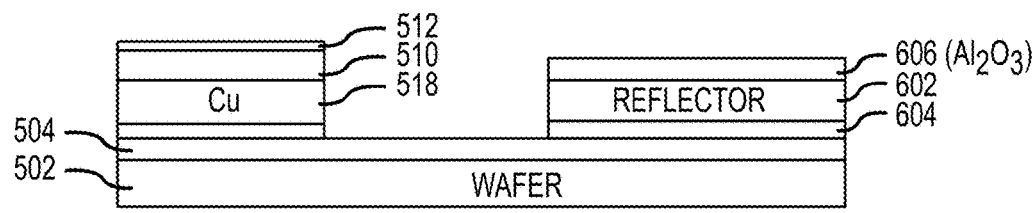
FIG. 6 shows a cross-sectional view of deposition of a conductive layer as a metallic reflector on a second portion of the wafer in accordance with embodiments of the disclosure.

FIG. 6 shows a cross-sectional view of deposition of a conductive layer as a metallic reflector on a second portion of the wafer in accordance with embodiments of the disclosure. A second conductive layer 602 is deposited over a second portion of the wafer 502. The second conductive layer 602 acts as the metal reflector for the holographic element.

An oxide layer 606 may be deposited over the second conductive layer 602, for example, using CVD, or PECVD, among others. The oxide layer 606 may include $Al_2O_3$, which acts as an etch stop layer. Again, a Ti adhesion layer 604 is deposited between the second conductive layer 602 and the $SiO_2$ layer 504. The $SiO_2$ layer 504 is deposited over the wafer 502. The second conductive layer 602 may include Cu, Al, or other CMOS compatible metals, among others. The deposition of the metal reflector and the Ti adhesion layer may use sputtering, or physical vapor deposition (PVD), among others.

Figure 7:
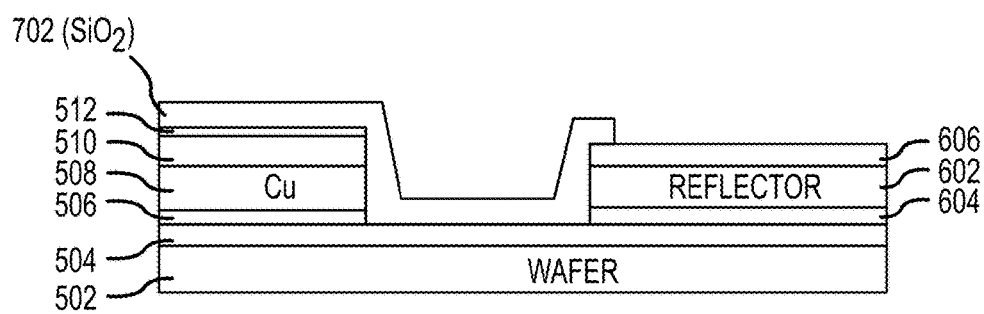
FIG. 7 shows a cross-sectional view of plasma enhanced chemical vapor deposition (PECVD) of dielectric layer (e.g. $SiO_2$) over the conductive layers and etching the dielectric layer in accordance with embodiments of the disclosure.

FIG. 7 shows a cross-sectional view of plasma enhanced chemical vapor deposition (PECVD) of dielectric layer (e.g. $SiO_2$) over the conductive layers and etching the dielectric layer in accordance with embodiments of the disclosure. As shown, an oxide layer 702, such as $SiO_2$, can be deposited over the first conductive layer 508 and a portion of the second conductive layer 602 by PECVD or CVD.

Figure 8:
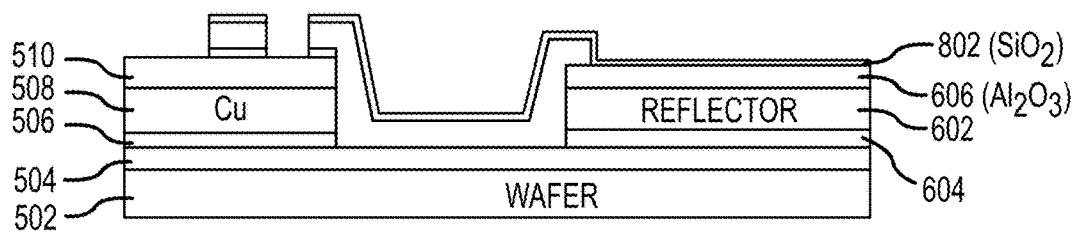
FIG. 8 shows a cross-sectional view of PECVD and etching of the dielectric layer (e.g. $SiO_2$) after the step of FIG. 7 in accordance with embodiments of the disclosure.

FIG. 8 shows a cross-sectional view of PECVD and etching of the dielectric layer (e.g. $SiO_2$) after the step of FIG. 7 in accordance with embodiments of the disclosure. As shown, a thin $SiO_2$ 802 is deposited over the $Al_2O_3$ layer 606 Also, the $SiO_2$ layers 702 and 802 as well as $TiO_2$ layer 512 are etched to expose the Ti layer 510 for the wirebond region.

Figure 9:
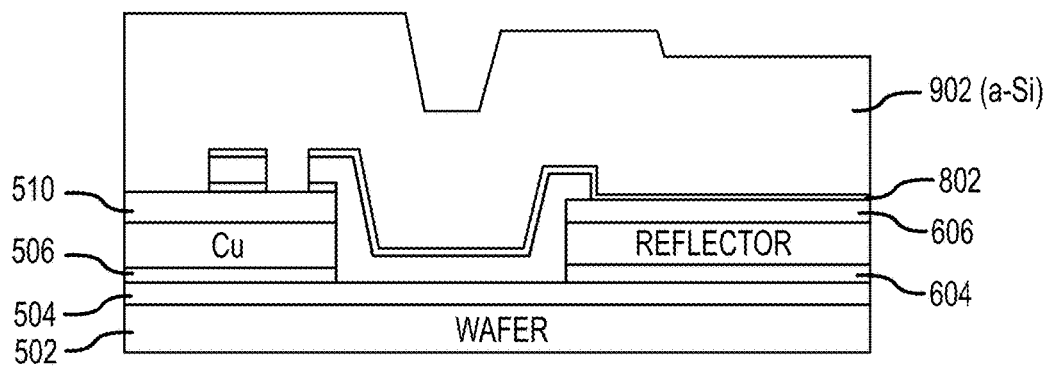
FIG. 9 shows a cross-sectional view of PECVD of amorphous silicon after the step of FIG. 8 in accordance with embodiments of the disclosure.

FIG. 9 shows a cross-sectional view of PECVD of amorphous silicon after the step of FIG. 8 in accordance with embodiments of the disclosure. As shown, a-Si layer 902 is deposited over the entire region including, both, the holographic region and the interconnect region. The Ti layer 510 allows bidirectional change flow of the a-Si layer 902. Most interfaces between metal and semiconductor form a 'schottky barrier', with diode behavior (i.e. one-way flow). The interface between Ti and a-Si, however, forms an 'ohmic contact' which readily conducts charge in either direction. The thin SiO2 layer 802 acts as an adhesion layer between the $Al_2O_3$ layer 606 and the dielectric layer (e.g. a-Si) 902.

Figure 10:
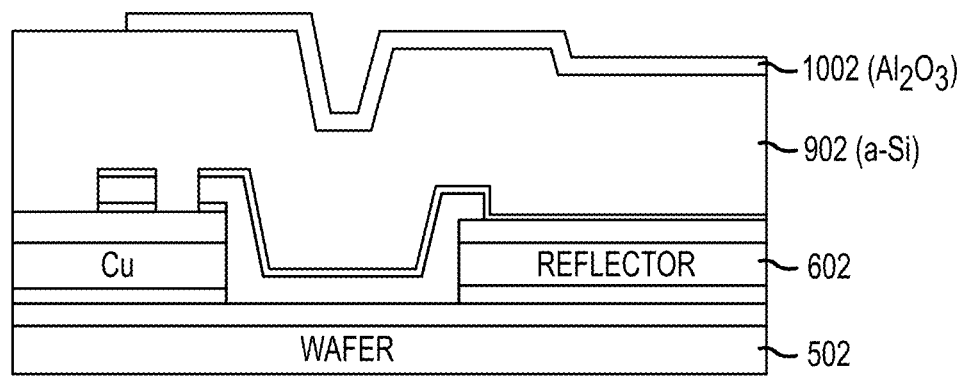
FIG. 10 shows a cross-sectional view of deposition of a hard mask (e.g. $Al_2O_3$) after the step of FIG. 9 in accordance with embodiments of the disclosure.

FIG. 10 shows a cross-sectional view of deposition of a hard mask (e.g. $Al_2O_3$) after the step of FIG. 9 in accordance with embodiments of the disclosure. As shown in FIG. 10, a hard mask 1002, such as $Al_2O_3$ is deposited over the a-Si layer 902. The hard mask 1002 is partially etched away to expose the a-Si layer in the wirebond region by low resolution process. Up to this stage, all these processes in FIGS. 1-10 are low resolution processes.

Figure 11:
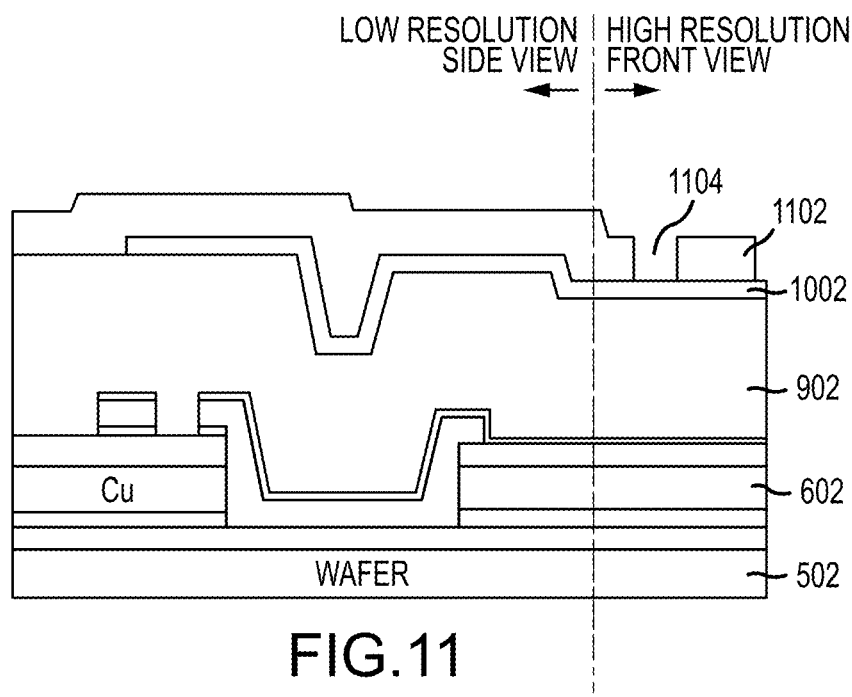
FIG. 11 shows a cross-sectional view of e-beam lithography of resist (e.g. PMMA) after the step of FIG. 10 in accordance with embodiments of the disclosure.

FIG. 11 shows a cross-sectional view of e-beam lithography of resist (e.g. PMMA) after the step of FIG. 10 in accordance with embodiments of the disclosure. The cross-sectional view includes a side view of an interconnect region including the first conductive layer (e.g. wire bond) on the left side, which may only need a low resolution process. The cross-sectional view also includes a front view of a holographic region 1106 including the second conductive layer (e.g. metallic reflector) on the right side, which may need a high resolution process. As shown in FIG. 11, a poly (methyl methacrylate) (PMMA) resist 1102 may be patterned to have a nano-scale gap 1104 in the holographic region 1106 by e-beam lithography or deep UV immersion lithography, each of which is a high resolution process.

Figure 12:
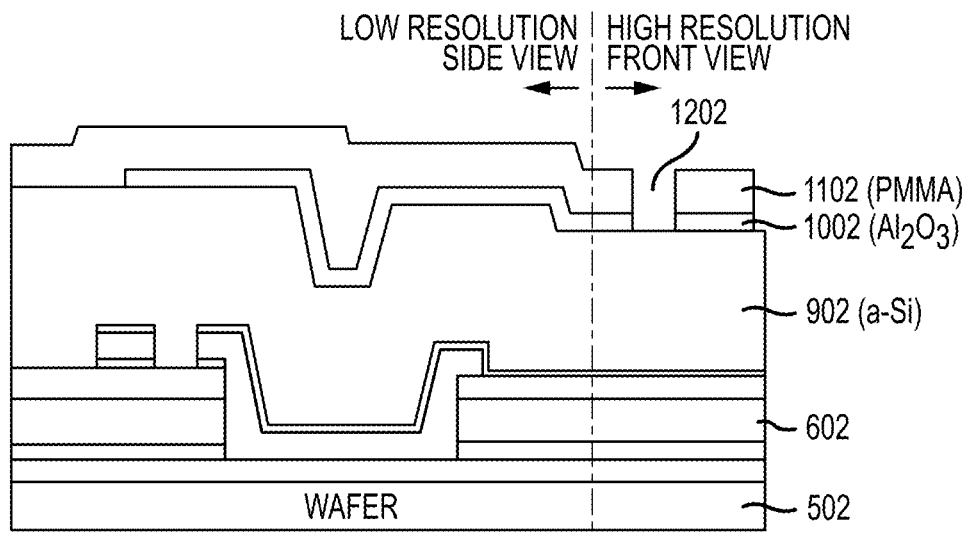
FIG. 12 shows a cross-sectional view of etching of the hard mask (e.g. $Al_2O_3$) with a patterned resist (e.g. PMMA) to form a nano-scale gap in the hard mask after the step of FIG. 11 in accordance with embodiments of the disclosure.

FIG. 12 shows a cross-sectional view of etching of the hard mask (e.g. Al$_2$O$_3$) with a patterned resist (e.g. PMMA) to form a nano-scale gap in the hard mask after the step of FIG. 11 in accordance with embodiments of the disclosure. The hard mask 1002, such as Al$_2$O$_3$, may form a nano-scale gap 1202 by plasma etching through using the patterned PMMA resist 1102. The nano-scale gap 1202 in the dielectric layer has substantially the same width as the nano-scale gap 1104 in the PMMA resist 1102. The plasma etching may include a mixture of Cl$_2$ and Ar plasma. Again, the etching of the hard mask is performed by e-beam lithography or deep UV immersion lithography, each of which is a high resolution process.

Figure 13:
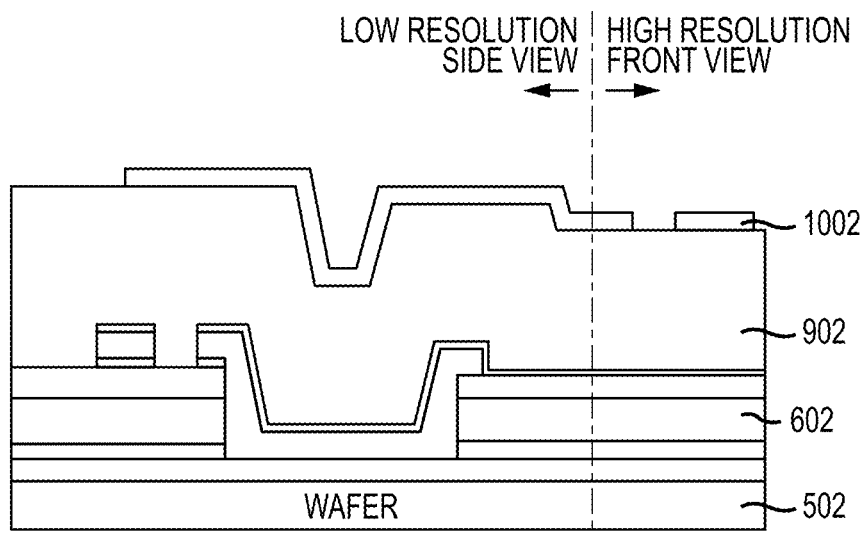
FIG. 13 shows a cross-sectional view of stripping the patterned resist (e.g. PMMA) after the step of FIG. 12 in accordance with embodiments of the disclosure.

FIG. 13 shows a cross-sectional view of stripping the resist (e.g. PMMA) after the step of FIG. 12 in accordance with embodiments of the disclosure. As shown, the PMMA resist 1102 may be stripped by using a chemical process. The PMMA resist may be removed by being exposed to an electron beam in e-beam lithography or exposed to UV light in deep UV immersion lithography. The PMMA resist can then be dissolved by using a developer. For example, the PMMA resist 1102 may be soaked in a solvent, such as acetone, until the PMMA resist is completely removed or stripped. Again, this step is a high resolution process.

Figure 14:
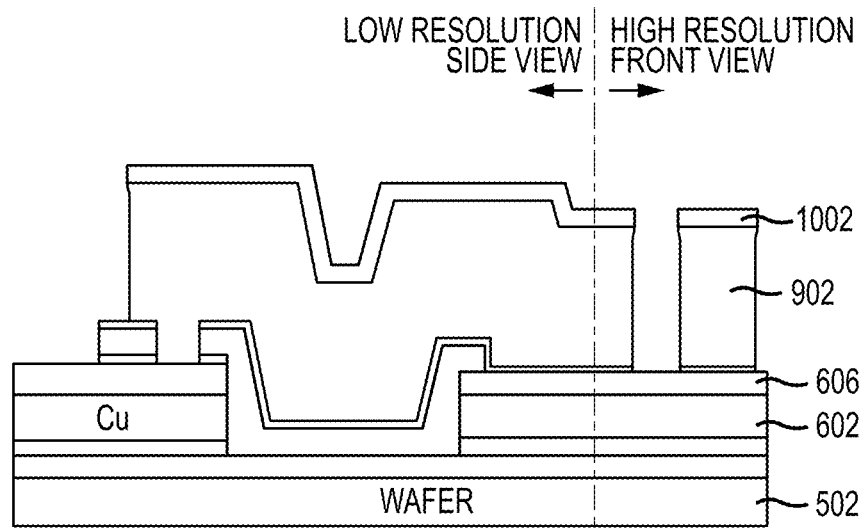
FIG. 14 shows a cross-sectional view of etching the a-Si layer with the patterned hard mask (e.g. $Al_2O_3$) to form a nano-scale gap of a high aspect ratio between the a-Si pillars in the a-Si layer and to expose the titanium layer after the step of FIG. 13 in accordance with embodiments of the disclosure.

FIG. 14 shows a cross-sectional view of etching the a-Si layer with the patterned hard mask to form a nano-scale gap of a high aspect ratio between the a-Si pillars in the a-Si layer and to expose the titanium layer after the step of FIG. 13 in accordance with embodiments of the disclosure. As shown, a-Si is etched to form a nano-scale gap 1402 by e-beam lithography or deep UV immersion lithography. Also, the a-Si layer 902 and the TiO$_2$ layer 512 are etched such that the Ti layer 510 is exposed in the interconnect region. Again, this step is a high resolution process.

In some embodiments, the nano-scale gap 1402 may be 100 nm wide and 840 nm deep, and the a-Si pillars may be 170 nm wide, which corresponds to a laser wavelength of 1550 nm. In some embodiments, the nano-scale gap 1402 has a width of 60 nm, a depth of 480 nm, the pillars may be 100 nm wide, which corresponds to a laser wavelength of 905 nm.

Figure 15:
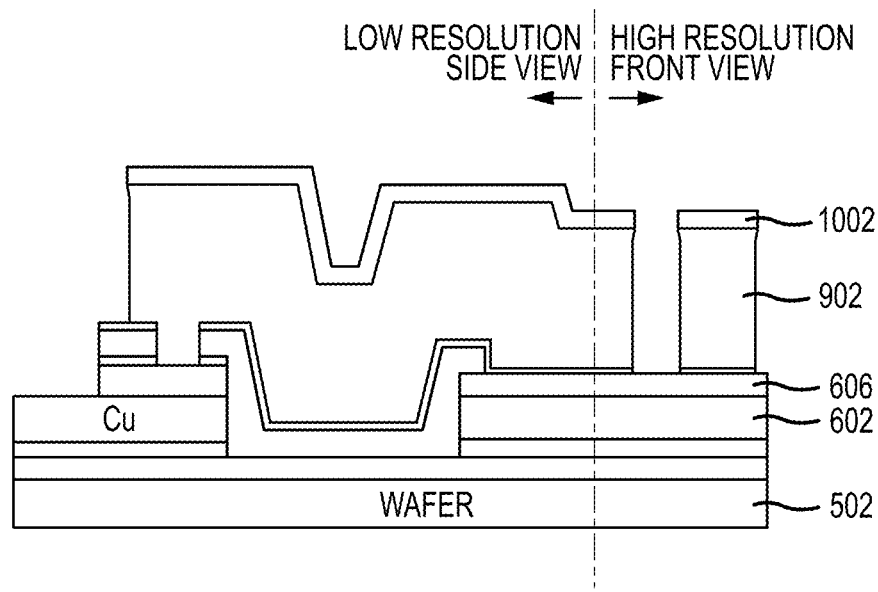
FIG. 15 shows a cross-sectional view of wet etching the titanium adhesion layer to expose the conductive layer after the step of FIG. 14 in accordance with embodiments of the disclosure.

FIG. 15 shows a cross-sectional view of wet etching the titanium layer to expose the conductive layer after the step of FIG. 14 in accordance with embodiments of the disclosure. As shown, the Ti adhesion layer 506 is etched away in the interconnect region. This is a low resolution process.

Figure 16:
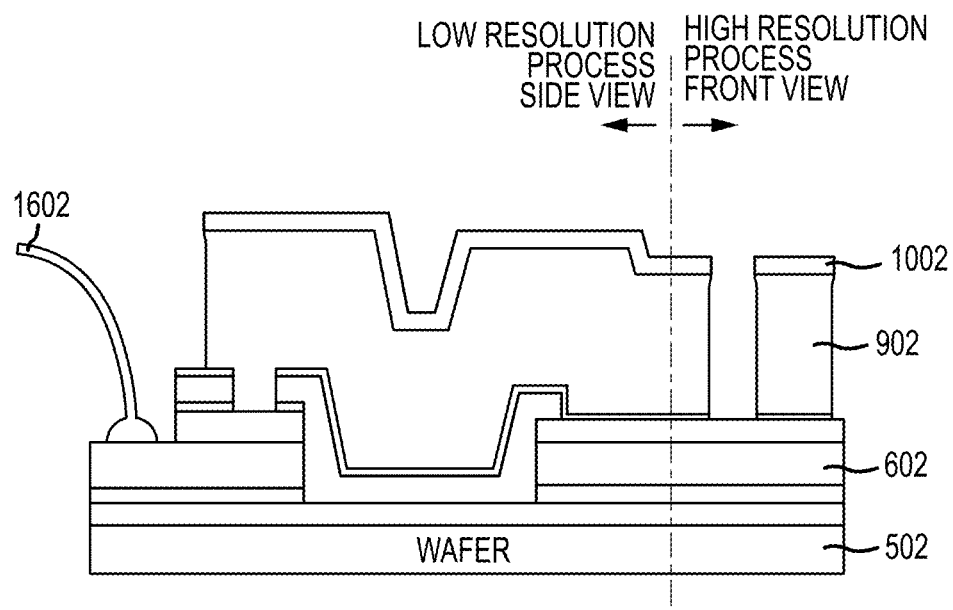
FIG. 16 shows a cross-sectional view of wire bonding to the conductive layer after the step of FIG. 15 in accordance with embodiments of the disclosure.

FIG. 16 shows a cross-sectional view of wire bonding to the conductive layer after the step of FIG. 15 in accordance with embodiments of the disclosure. As shown, a wire bus 1602 is wire bonded to the first conductive layer 508. This is also a low resolution process.

Figure 17:
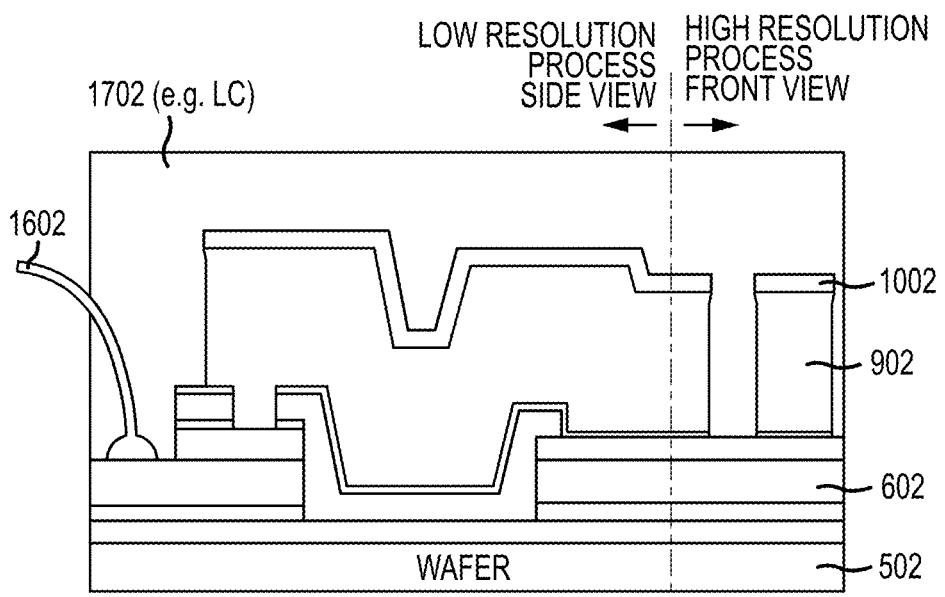
FIG. 17 shows a cross-sectional view of applying liquid crystal to fill the nano-scale gap between the a-Si pillars in the a-Si layer after the step of FIG. 16 *in* accordance with embodiments of the disclosure.

FIG. 17 shows a cross-sectional view of applying liquid crystal to fill the gap in the a-Si layer after the step of FIG. 16 in accordance with embodiments of the disclosure. As shown, liquid crystal 1702 is applied to cover the entire interconnect region and the holographic region including the nano-scale gap 1402.

Pseudo-Bosch Process at Cryogenic Temperatures

Figure 18:
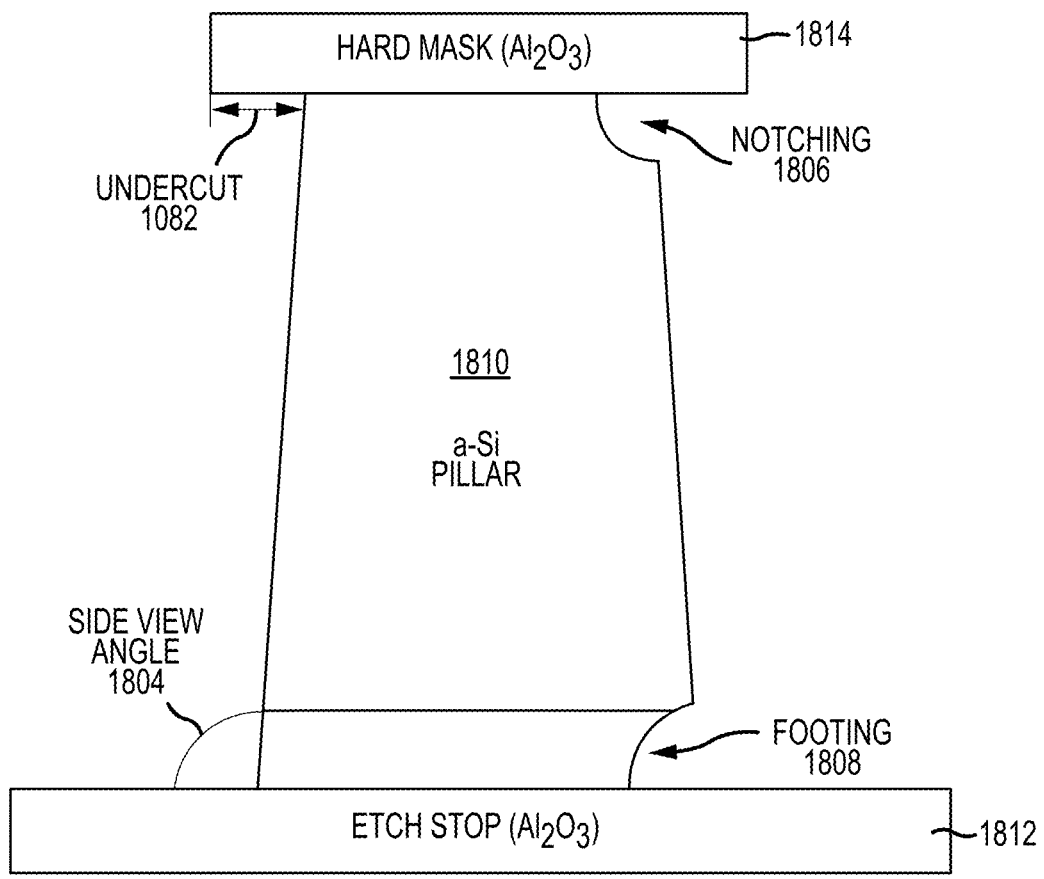
FIG. 18 shows the processing issues near an amorphous silicon pillar in accordance with embodiments of the disclosure.

The disclosure provides methods of performing the pseudo-Bosch process at cryogenic temperatures. FIG. 18 illustrates processing issues including undercut near amorphous silicon pillar in accordance with embodiments of the disclosure. The etching of the a-Si pillars may be characterized by geometric parameters defined in FIG. 18. An undercut 1802 is the distance between the edge of the hard mask and the actual feature wall.

Practically, a required undercut is given by the following equation:

Allowable undercut=(Target etch width−minimum resolution)/2

For example, if the target is a 100 nm trench and the e-beam can create 50 nm features, then the maximum allowable undercut is 25 nm. The undercut should be not more than 40 nm.

In some embodiments, the undercut is less than 40 nm. In some embodiments, the undercut is less than 30 nm. In some embodiments, the undercut is less than 20 nm. In some embodiments, the undercut is less than 15 nm. In some embodiments, the undercut is less than 10 nm. In some embodiments, the undercut is less than 5 nm.

A sidewall angle 1804 is the angle between the etch stop layer 1812 over the substrate and the wall 1810 of the dielectric pillar. Theoretically, the sidewall angel is 90°. Practically, as depicted, the sidewall angle 1804 may be above 80°, for example, 93°.

In some embodiments, the sidewall angle is equal to or less than 100°. In some embodiments, the sidewall angle is equal to or less than 98°. In some embodiments, the sidewall angle is equal to or less than 96°. In some embodiments, the sidewall angle is equal to or less than 94°. In some embodiments, the sidewall angle is equal to or less than 92°. In some embodiments, the sidewall angle is equal to or less than 90°. In some embodiments, the sidewall angle is equal to or less than 88°. In some embodiments, the sidewall angle is equal to or less than 86°. In some embodiments, the sidewall angle is equal to or less than 84°. In some embodiments, the sidewall angle is equal to or less than 82°. In some embodiments, the sidewall angle is greater than 80°. In some embodiments, the sidewall angle is greater than 82°. In some embodiments, the sidewall angle is greater than 84°. In some embodiments, the sidewall angle is greater than 86°. In some embodiments, the sidewall angle is greater than 88°. In some embodiments, the sidewall angle is greater than 90°. In some embodiments, the sidewall angle is equal to or less than 92°. In some embodiments, the sidewall angle is equal to or less than 94°. In some embodiments, the sidewall angle is equal to or less than 96°. In some embodiments, the sidewall angle is equal to or less than 98°.

In some embodiments, both the notching 1806 and footing 1808 have a characteristic size of less than 50 nm. In some embodiments, both the notching and footing have a characteristic size of less than 40 nm. In some embodiments, both the notching and footing have a characteristic size of less than 30 nm. In some embodiments, both the notching and footing have a characteristic size of less than 20 nm. In some embodiments, both the notching and footing have a characteristic size of less than 10 nm. In some embodiments, the notching and footing may be smaller than half of the width of the element, which may cause a minor degradation in optical performance.

In some embodiments, the etch depth of the nano-scale gap between the dielectric pillars is deep, for example, 840 nm. The hard mask material may be selected as Al$_2$O$_3$, such that the hard mask may have an etch rate of at least 30 times slower than that of a-Si, which can reduce the undercut.

In some embodiments, the disclosed method may avoid to produce nanospikes, which are commonly called 'Si Black' or 'Grass'.

In some embodiments, the etching may be performed by using a plasma etcher, such as an Oxford PlasmaLab 100 Inductively Coupled Plasma Etcher among others. A Pseudo-Bosch process may be used to perform the etching with a mixture of $SF_6$ and $C_4F_8$ gases. The $SF_6$ etching has both isotropic and anisotropic components and can etch anisotropically downwards. However, the $C_4F_8$ gas isotropically deposits an isotropic protective layer or protective coating and can be used to reduce the etch rate in all directions.

As an example, $SF_6$ alone may etch laterally at a first rate, e.g. 100 nm/min, and etch downwards at a second rate, e.g. 200 nm/min. The $C_4F_8$ may deposit a protective layer that reduces the etch rate by 100 nm/min in all directions. Hence, the net etch rate is zero laterally, and 100 nm/min downwards.

The pseudo-Bosch process includes various etching parameters, such as gas concentration, chamber pressure and plasma power, temperature, to control undercut and sidewall angles, among others. When an etching parameter, such as $C_4F_8$ concentration, decreases, the undercut may increase and the sidewall angle may be reduced such that the trench may become wider with depth.

The undercut may also vary with the material. For example, when the same etching parameters for mono-crystalline or poly-crystalline silicon are used for amorphous silicon, the undercut is significantly large, such as 200 nm or more for amorphous silicon. The large undercut in a-Si may limit its use to a micron scale application.

Applicants surprisingly discover that cryogenically cooling amorphous Si to a temperature below room temperature can etch the amorphous silicon with a reduced undercut, for example, less than 10 nm. It is believed that a lower temperature may increase the rate of protective $C_4F_8$ deposition and may also decrease the random thermal energy in the amorphous Si. As such, more energy may be required to break the bonds between a-Si atoms at reduced temperature, which may bring the behavior closer to that of crystalline or poly-crystalline silicon.

In some embodiments, the a-Si may be etched at temperatures below room temperature to obtain an undercut of less than 50 nm, preferably 10 nm. In some embodiments, the a-Si may be cooled to 10° C. or below. In some embodiments, the a-Si may be cooled to 5° C. or below. In some embodiments, the a-Si may be cooled to 0° C. or below. In some embodiments, the a-Si may be cooled to −5° C. or below. In some embodiments, the a-Si may be cooled to −10° C. or below. In some embodiments, the a-Si may be cooled to −15° C. or below. In some embodiments, the a-Si may be cooled to −20° C. or below. In some embodiments, the a-Si may be cooled to −30° C. or below. In some embodiments, the a-Si may be cooled to −40° C. or below. In some embodiments, the a-Si may be cooled to −50° C. or below. In some embodiments, the a-Si may be cooled to −60° C. or below. In some embodiments, the a-Si may be cooled to −70° C. or below. In some embodiments, the a-Si may be cooled to −80° C. or below. In some embodiments, the a-Si may be cooled to −90° C. or below. In some embodiments, the a-Si may be cooled to −100° C. or below. In some embodiments, the a-Si may be cooled to −110° C. or below.

In some embodiments, the etching parameters may be adjusted at room temperature to obtain an undercut of less than 50 nm, preferably 10 nm.

Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall in between.

What is claimed is:

1. A method for fabricating an optical metasurface, the method comprising:
    depositing a conductive layer over a holographic region of a wafer;
    depositing a dielectric layer over the conducting layer;
    patterning a hard mask on the dielectric layer; and
    etching the dielectric layer to form a plurality of dielectric pillars with a plurality of nano-scale gaps between the pillars.

2. The method of claim 1, wherein the patterning is performed by e-beam lithography.

3. The method of claim 1, wherein the patterning is performed by deep UV immersion lithography.

4. The method of claim 1, further comprising filling the plurality of nano-scale gaps with a refractive index tunable core material.

5. The method of claim 4, wherein the refractive index tunable core material comprises a liquid crystal or EO polymers.

6. The method of claim 5, the step of filling the plurality of nano-scale gaps comprising:
    preparing the surface to be hydrophobic or hydrophilic;
    spin coating the liquid crystal over the plurality of pillars;
    filling the liquid crystal into the nano-scale gap by a capillary action; and
    encapsulating the liquid crystal with a clear coating.

7. The method of claim 5, the step of filling the plurality of nano-scale gaps comprising:
    applying a coating to a first portion of the plurality of nano-scale gaps;
    spin coating the liquid crystal onto the plurality of dielectric pillars;
    filling the liquid crystal into a second portion of the plurality of nano-scale gaps by a capillary action; and
    encapsulating the liquid crystal with a clear coating.

8. The method of claim 1, wherein the plurality of dielectric pillars comprises a constant gap between each of the pillars.

9. The method of claim 1, wherein the plurality of dielectric pillars comprises a plurality of pairs of dielectric pillars.

10. The method of claim 9, wherein the gap between each pair of pillars is smaller than the gap between two adjacent pairs of pillars.

11. The method of claim 1, wherein the plurality of dielectric pillars comprises amorphous silicon.

12. The method of claim 1, wherein the refractive index tunable core material comprises chalcogenide glass.

13. The method of claim 12, the step of filling the plurality of nano-scale gaps comprising:
   depositing the chalcogenide glass over the dielectric pillars by sputtering; and removing the chalcogenide glass from all areas except inside the plurality of nano-scale gaps.

14. The method of claim 1, the step of depositing a dielectric layer over a conducting layer comprising:
   depositing an etch-stop dielectric layer over the conducting layer; and
   depositing the dielectric layer over the etch-stop dielectric layer.

15. The method of claim 14, wherein the etch-stop dielectric layer comprises $Al_2O_3$.

16. The method of claim 1, wherein the aspect ratio of height to width of the nano-scale gap is at least 5.

17. The method of claim 1, the step of patterning a hard mask on the dielectric layer comprising:
   depositing a hard mask over the dielectric layer;
   patterning the hard mask to remove a first portion of the hard mask near an interconnect region;
   patterning the hard mask by a high resolution process to form the nano-scale gap;
   plasma etching the hard mask to remove a second portion of the hard mask in the nano-scale gap to expose the dielectric layer.

18. The method of claim 17, wherein the hard mask comprises $Al_2O_3$.

19. The method of claim 17, wherein patterning the hard mask to remove a first portion of the hard mask near an interconnect region is performed by a low resolution process.

20. The method of claim 1, further comprising forming a plurality of conductive contacts over an interconnect region of the wafer for wire bonding to a CMOS, the plurality of conductive contacts configured to apply voltage to the plurality of dielectric pillars.

21. An optical metasurface fabricated by the method of claim 1.

* * * * *